United States Patent [19]

Fukushima

[11] Patent Number: 4,654,688
[45] Date of Patent: Mar. 31, 1987

[54] SEMICONDUCTOR DEVICE HAVING A TRANSISTOR WITH INCREASED CURRENT AMPLIFICATION FACTOR

[75] Inventor: Toshitaka Fukushima, Yokohama, Japan

[73] Assignee: Fujitsu Limited, Kawasaki, Japan

[21] Appl. No.: 686,895

[22] Filed: Dec. 27, 1984

[30] Foreign Application Priority Data

Dec. 29, 1983 [JP] Japan ................................ 58-247700

[51] Int. Cl.[4] ............................................ H01L 27/02
[52] U.S. Cl. .......................................... 357/46; 357/20; 357/48; 357/38; 357/88
[58] Field of Search ................. 357/46, 38, 92, 34, 357/20, 48, 88

[56] References Cited

U.S. PATENT DOCUMENTS

| 3,450,961 | 6/1969 | Tsai ............................ 357/34 |
| 3,913,123 | 10/1975 | Masaki et al. ................. 357/34 |
| 4,081,697 | 3/1978 | Nakano ...................... 357/46 X |
| 4,118,250 | 10/1978 | Horng et al. ................... 357/34 |
| 4,275,408 | 6/1981 | Yukimoto ...................... 357/38 |
| 4,458,158 | 7/1984 | Mayrand ..................... 357/46 X |

FOREIGN PATENT DOCUMENTS 1159158 12/1983 Canada ............................ 357/38 S

OTHER PUBLICATIONS

Stone, "I[2]L: A Comprehensive Review of Techniques and Tech.", *Solid State Technology*, Jun. 1977, pp. 42–48.

*Primary Examiner*—Martin H. Edlow
*Attorney, Agent, or Firm*—Staas & Halsey

[57] ABSTRACT

A semiconductor device having a lateral transistor consisting of a semiconductor substrate, a first semiconductor region, and a second semiconductor region operatively functioning as a collector, a base, and an emitter of a transistor. By providing a high concentration region in the first semiconductor region, the base width of the transistor is narrowed. In a PROM, a reverse current preventing transistor with such a narrowed base width in each memory cell can be driven by a decoder/driver with a lowered driving power consumption.

10 Claims, 9 Drawing Figures

PROM

SEMICONDUCTOR DEVICE HAVING A TRANSISTOR WITH INCREASED CURRENT AMPLIFICATION FACTOR

BACKGROUND OF THE INVENTION

The present invention relates to a semiconductor device having a transistor with an increased current amplification factor, and more particularly, to a programmable read only memory (PROM) in which each memory cell with a vertical PNP transistor for preventing reverse current is improved in structure for decreasing the driving power consumption of a decoder/driver.

In general, a PROM includes a plurality of memory cells, and each memory cell consists of a vertical PNP transistor for preventing reverse current and a programmable element connected between the emitter of the vertical PNP transistor and a bit line. To write into or to read from the PROM, a word line and a bit line are selectively driven. The selective driving of a word line is carried out by a decoder/driver at a certain power consumption, and in order to increase the degree of integration and to lower the overall power consumption of the PROM, the driving power consumption of the decoder/driver for driving a word line should be kept as low as possible.

One way of achieving a lower driving power consumption of the decoder/driver is to increase the packing density of a memory cell size of the PROM, thus enabling each element to be driven with a small current. This approach is disclosed in an article by Toshitaka Fukushima, Kouji Ueno, and Kazuo Tanaka, entitled "A High Speed Schottky 4k-Bit PROM Using Diffused Eutectic Aluminum Process (Deap)", Proceedings of the 11th Conference (1979 International) on Solid State Devices, Tokyo, 1979; Japanese Journal of Applied Physics, Vol. 19 (1980) Supplement 19-1, pp 175–180. In this reference, in order to suppress undesirable parasitic effects due to the increased packing density, two techniques, i.e., "Shallow V Groove" (SVG) and Isolation by Oxide and Polysilicon (IOP) are employed.

In the conventional PROM, however, because the current amplification factor of the vertical PNP transistor for preventing reverse current is relatively small, the decoder/driver is still required to sink a relatively large current, as later described in detail. Therefore, there are problems in the conventional PROM wherein the decoder/driver occupies a large area and requires a high power consumption.

SUMMARY OF THE INVENTION

Accordingly, an object of the present invention is to provide a semiconductor device having a transistor with an increased current amplification factor.

Another object of the present invention is to provide a PROM in which the driving power consumption of the decoder/driver is made low, so as to realize an increased packing density and a low power consumption, by increasing the current amplification factor of each vertical PNP transistor for preventing reverse current.

To attain the above objects, there is provided, according to the present invention, a semiconductor device comprising: a semiconductor substrate having a first conductivity type; a first semiconductor region formed on the semiconductor substrate and having a second conductivity type opposite to the first conductivity type; a second semiconductor region formed in the first semiconductor region and having the first conductivity type; a high concentration buried region formed under the second semiconductor region and between the semiconductor substrate and the first semiconductor region, the buried region having the second conductivity type but with a higher impurity concentration than the impurity concentration in the first semiconductor region; and a third semiconductor region formed in the first semiconductor region other than the high concentration buried region, having the first conductivity type. The third semiconductor region is projected from the semiconductor substrate toward the second semiconductor region.

According to another aspect of the present invention, there is provided a programmable read only memory (PROM) comprising: a plurality of word lines; a plurality of bit lines intersecting the word lines; and memory cells arranged on the intersecting portions between the word lines and the bit lines. Each of the memory cells comprises a programmable element and a transistor connected to one end of the programmable element. The other end of the programmable element is connected to one of the bit lines, and the transistor has a base connected to one of the word lines. Each of the memory cells comprises a semiconductor substrate having a first conductivity type, a first semiconductor layer provided on the semiconductor substrate and having a second conductivity type opposite to the first conductivity type, a second semiconductor layer provided in the first semiconductor layer and having the first conductivity type, a third semiconductor layer provided in the second semiconductor layer and having the second conductivity type, and a high concentration buried layer provided between the semiconductor substrate and the first semiconductor layer. The transistor in each of the memory cells is constructed by the semiconductor substrate, the first semiconductor layer, and the second semiconductor layer. The programmable element in each of the memory cells is constructed by the second semiconductor layer and the third semiconductor layer. Each of the memory cells further comprises a high concentration region provided in the first semiconductor layer. The high concentration region is projected from the semiconductor substrate toward the second semiconductor layer, whereby the base width of the transistor is narrowed.

The high concentration region may alternatively be projected from the second semiconductor region toward the semiconductor substrate.

BRIEF DESCRIPTION OF THE DRAWINGS

The above objects and features of the present invention will be more apparent from the following description of the preferred embodiments with reference to the accompanying drawings; wherein.

DESCRIPTION OF THE PREFERRED EMBODIMENTS

Figure 1:
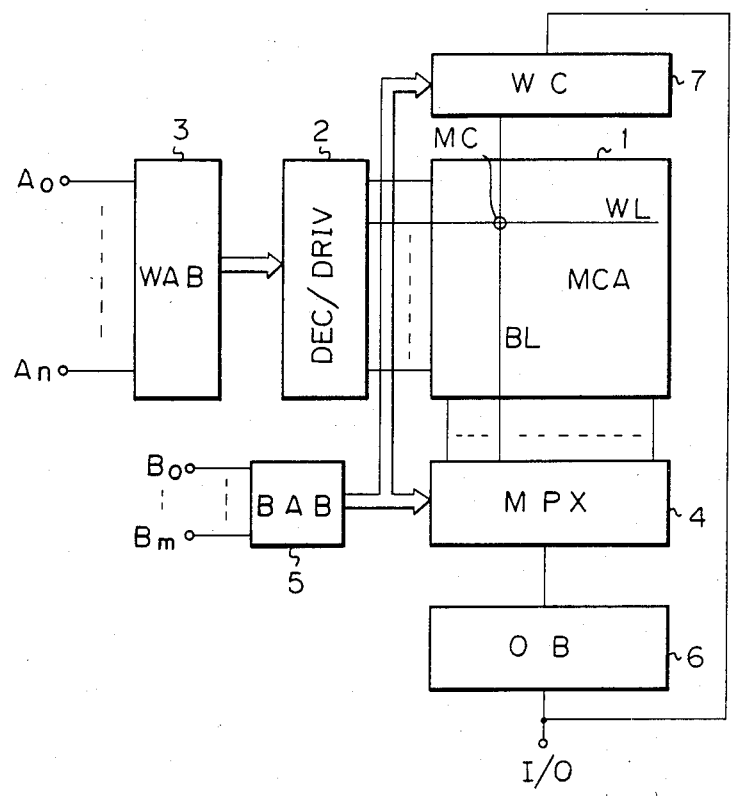
FIG. 1 is a block circuit diagram of a PROM relating to the present invention.

FIG. 1 shows a general constitution of a PROM relating to the present invention. In FIG. 1, the PROM comprises a memory cell array (MCA) 1, a decoder/driver (DEC/DRIV) 2, a word address buffer circuit (WAB) 3, a multiplexer (MPX) 4, a bit address buffer circuit (BAB) 5, an output buffer circuit (OB) 6, and a write-in circuit (WC) 7. The memory cell array (MCA) 1 comprises memory cells MC arranged on respective intersections between a plurality of word lines WL and a plurality of bit lines BL.

The decoder/driver (DEC/DRIV) 2 selectively drives a single word line WL at one time in accordance with a word address signal consisting of a plurality of data $A_0, A_1, \ldots, A_n$. The multiplexer (MPX) 4 and the write-in circuit (WC) 7 selectively drive a single bit line BL at one time in accordance with a bit address signal consisting of a plurality of data $B_0, B_1, \ldots, B_n$. Thus, writing or reading is carried out into or from a memory cell MC which is arranged on an intersection between the selected word line and the selected bit line. The write data is applied through an input/output terminal I/O and the write-in buffer circuit (WC) 7 to the selected memory cell. The read data is output through the multiplexer (MPX) 4 and the output buffer circuit (OB) 6 to the input/output terminal I/O.

Figure 2:
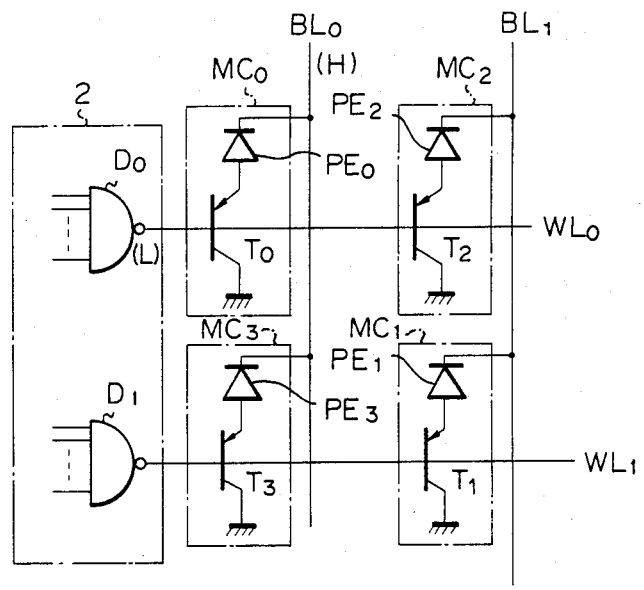
FIG. 2 is a circuit diagram of a part of the PROM shown in FIG. 1, in which examples of memory cells are shown.

FIG. 2 is a circuit diagram showing an example of memory cells MC included in the PROM shown in FIG. 1. In FIG. 2, four memory cells $MC_0$ through $MC_3$ are shown. The memory cell $MC_0$ is arranged on an intersecting portion between a word line $WL_0$ and a bit line $BL_0$. The memory cell $MC_1$ is arranged on an intersecting portion between a word line $WL_1$ and a bit line $BL_1$. The memory cells $MC_2$ and $MC_3$ are arranged on intersecting portions between the word line $WL_0$ and the bit line $BL_1$, and between the word line $WL_1$ and the bit line $BL_0$, respectively. These memory cells $MC_0$ through $MC_3$ are shown as junction-short type cells as an example. That is, for example, the memory cell $MC_0$ consists of a PNP transistor $T_0$ for preventing reverse current and a programmable element $PE_0$ which is realized, in this embodiment, by a diode. The transistor $T_0$ has a collector connected to the ground, a base connected to the word line $WL_0$, and an emitter connected to the anode of the diode as the programmable element $PE_0$. The cathode of the programmable element $PE_0$ is connected to the bit line $BL_0$. The other memory cells $MC_1$ through $MC_3$ have the same constitution as the memory cell MC. That is, $MC_1$ constitutes a transistor $T_1$ and a programmable element $PE_1$; $MC_2$ constitutes a transistor $T_2$ and a programmable element $PE_2$; and $MC_3$ constitutes a transistor $T_3$ and a programmable element $PE_3$.

To write data into the memory cell $MC_0$, the word line $WL_0$ is selected to be turned to a low potential level (L level) and a write-in pulse is applied to the bit line $BL_0$, whereby the programmable element $PE_0$ is either short-circuited or not short-circuited. If the programmable element is short-circuited, a data, for example, "1", is then written into the memory cell $MC_0$. If the programmable element is not short-circuited, a data, for example, "0", is written into the memory cell $MC_0$.

To read data "1" or "0" from the memory cell $MC_0$, the word line $WL_0$ is selected to be turned to the L level and the bit line $BL_0$ is selected to be turned to the high potential level (H level). Then, if a current flows through the selected programmable element $PE_0$, the read data is "1"; and if a current does not flow through the selected programmable element $PE_0$, the read data is "0".

A similar operation as for the memory cell $MC_0$ mentioned above is carried out for the other memory cells when writing or reading data.

The non-selected word lines are at the H level. Therefore, the PNP transistors connected to the non-selected word lines are in an OFF state. Accordingly, reverse current is prevented from flowing from the non-selected word lines to the bit lines.

Figure 3:
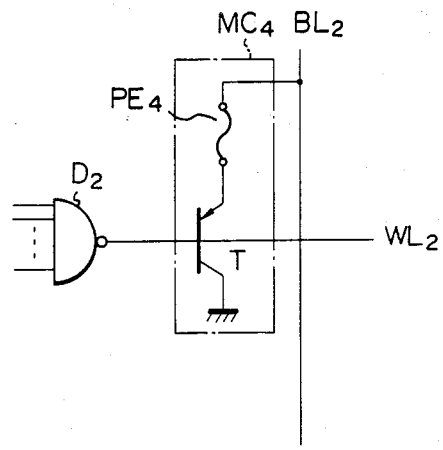
FIG. 3 is a circuit diagram of another example of a memory cell in the PROM shown in FIG. 1.

FIG. 3 shows another example of memory cells MC shown in FIG. 1. In FIG. 3, a fuse-blown type memory cell $MC_4$ is shown which consists of a programmable element $PE_4$ realized by a fuse in place of the diode shown in FIG. 2, and a PNP transistor $T_4$. Writing into the memory cell $MC_4$ is carried out by blowing or not blowing the programmable element $PE_4$ of the fuse. The selective driving of the word line $WL_2$ and the bit line $BL_2$ for reading or writing is carried out in a similar way as for the memory cells shown in FIG. 2.

Figure 4:
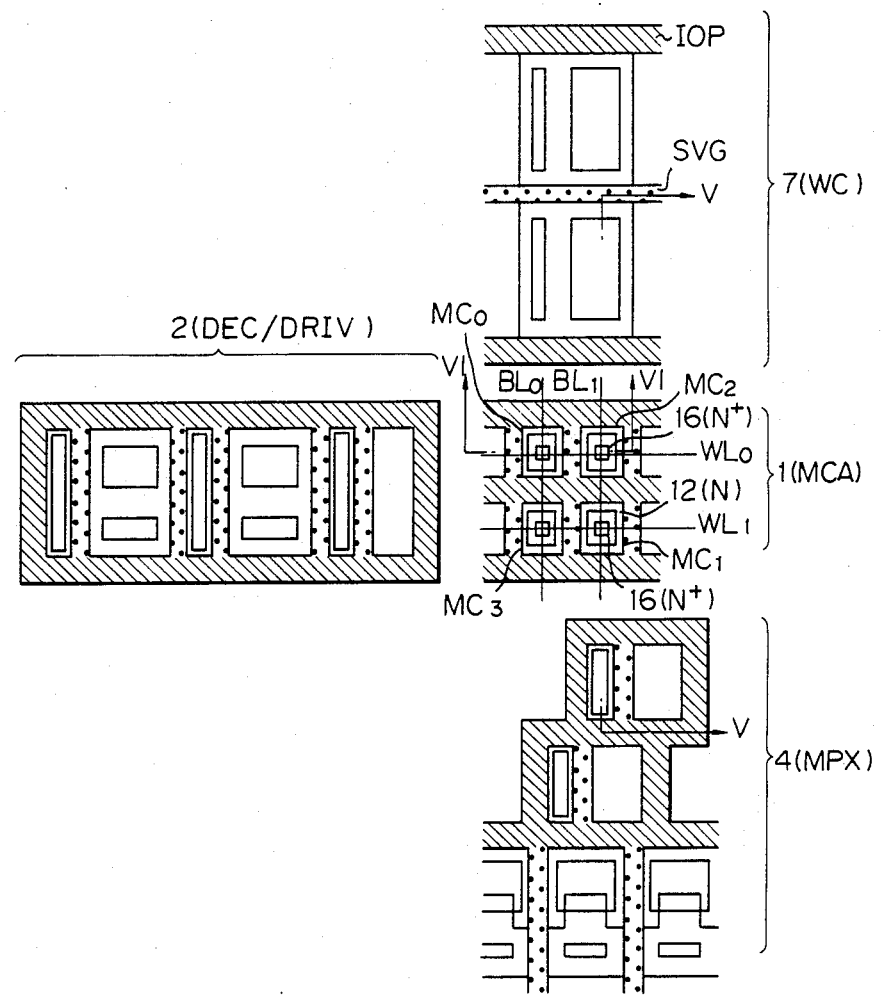
FIG. 4 is a plan view of an architectural structure of a part of the PROM including a junction-short type memory cell, according to an embodiment of the present invention.
Figure 5A:
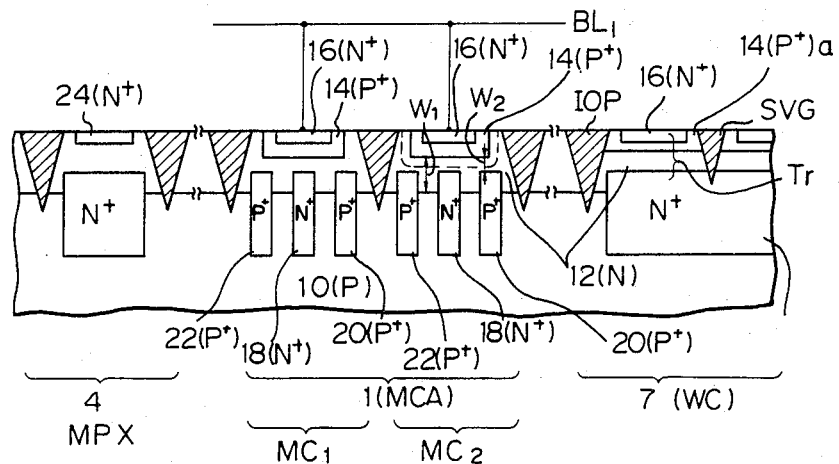
FIG. 5A is a cross-sectional view taken along line V—V in FIG. 4.
Figure 6:
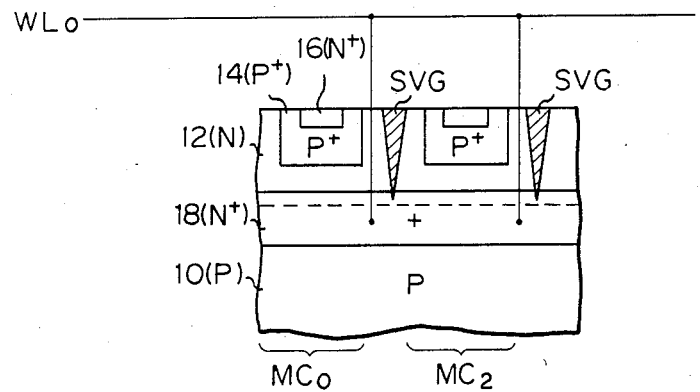
FIG. 6 is a cross-sectional view taken along line VI—VI in FIG. 4.
Figure 7:
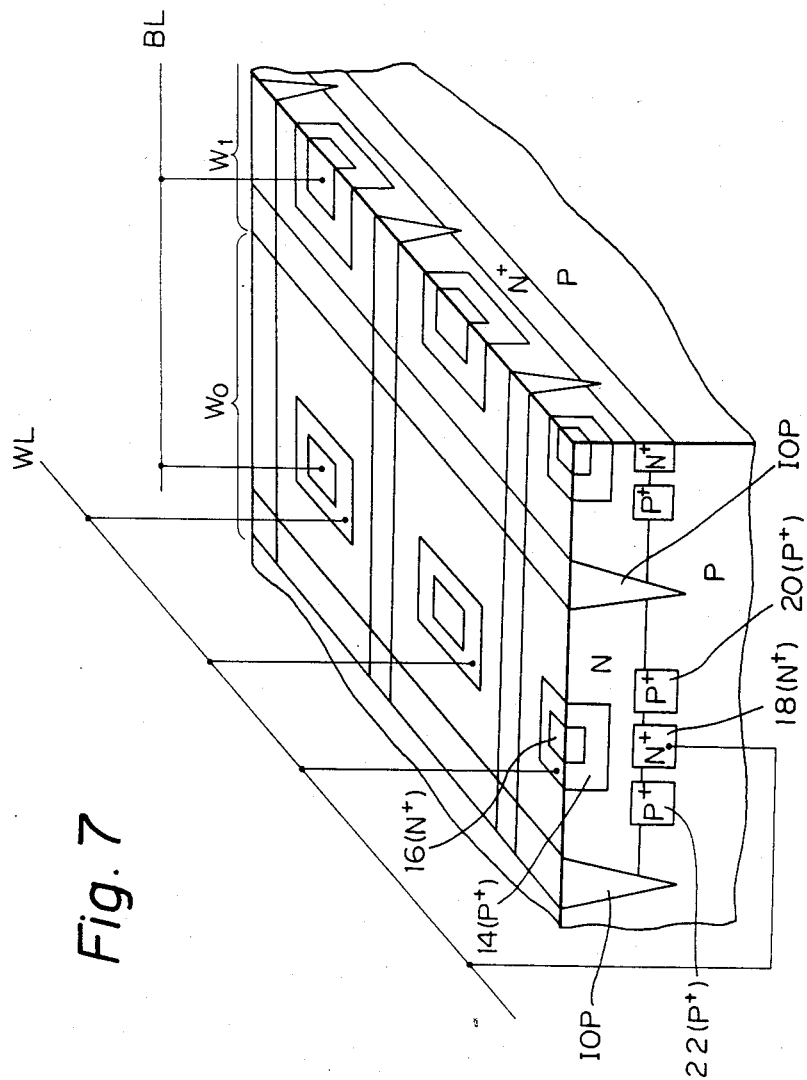
FIG. 7 is a perspective view of the PROM according to the embodiment of the present invention.

FIG. 4 is a plan view showing an architectural structure of a part of the PROM including a junction-short type memory cell shown in FIG. 2, according to an embodiment of the present invention. FIG. 5A is a cross-sectional view taken along line V—V in FIG. 4; FIG. 6 is a cross-sectional view taken along line VI—VI in FIG. 4; and FIG. 7 is a perspective view of a PROM according to an embodiment of the present invention. The overall architectural structure of the PROM according to the embodiment of the present invention can be seen from FIGS. 4, 5A, 6, and 7. In FIGS. 4, 5A, 6, and 7, a part of a memory cell array (MCA) 1 (see FIG. 1) and a part of its peripheral circuit, for example, the decoder/driver (DEC/DRIV) 2, the multiplexer (MPX) 4, and the write-in circuit (WC) 7 are illustrated. The memory cells $MC_0$ through $MC_4$ are electrically isolated from each other by an Isolation Oxide and Polysilicon region (IOP) and a Shallow V-Groove (SVG) region. Transistors Tr are also electrically isolated by the IOP and the SVG.

Each memory cell MC is formed by a P-type semiconductor substrate 10(P), an N-type epitaxial layer 12(N) formed by growing on the P-type semiconductor substrate 10(P), a high concentration P+-type diffusion region 14(P+) formed by diffusion of impurities with a high concentration at the surface of the N-type epitaxial layer 12(N), a high concentration N+-type diffusion region 16(N+) formed by diffusion of impurities with a high concentration at the surface of the P+-type diffusion region 14(P+), and a high concentration N+-type buried layer 18(N+) formed between the N-type epitaxial layer 12(N) and the P-type semiconductor substrate 10(P).

The N+-type diffusion region 16(N+) in each memory cell MC is a cathode region of a programmable element, i.e., a diode. For example, in FIGS. 4 and 5A, the diffusion regions 16(N+) in the memory cells $MC_1$ and $MC_2$, which are the cathode regions of the diodes as the programmable elements $PE_1$ and $PE_2$ shown in FIG. 2, are connected to the bit line $BL_1$.

The P+-type diffusion region 14(P+) in each memory cell MC is a common region for the anode of the diode and the emitter of the reverse current preventing PNP transistor, for example $T_0$ in FIG. 2.

The N-type epitaxial layer 12(N) in each memory cell is a base region of the reverse current preventing PNP transistor. The N-type epitaxial layer 12(N) in each memory cell is connected through the N+-type buried layer 18(N+) to the corresponding word line, e.g., $WL_0$, as shown in FIG. 6.

Thus, the reverse current preventing PNP transistors $T_0$, $T_1$, $T_2$, and $T_3$ are formed as vertical PNP transistors.

The N+-type buried layer 18(N+) functions to reduce the resistance of the word line $WL_0$ or $WL_1$.

According to an embodiment of the present invention, there are further provided two high concentration P+-type buried layers 20(P+) and 22(P+) in each memory cell MC, as shown in FIG. 5A. The P+-type buried layers 20(P+) and 22(P+) are formed in such a manner that they project from the P-type semiconductor substrate 10(P) toward the P+-type diffusion region 14(P+) in an area other than the N+-type buried layer 18(N+). These projecting portions are formed by diffusion during the growing of the N-type epitaxial layer 12(N) or during the diffusion processes used to form the P+-type diffusion region 14(P+) and the N+-type diffusion region 16(N+). As a result, the distance $W_2$ between the top surface of the P+-type buried layer 20(P+) or 22(P+) and the bottom surface of the P+-type diffusion region 14(P+) is smaller than the distance $W_1$ between the P-type semiconductor substrate 10(P) and the bottom surface of the P+-type diffusion region 14(P+). The distance $W_2$ is the base width of the reverse current preventing PNP transistor. Therefore, according to the embodiment shown in FIG. 5A, the base width $W_2$ of the PNP transistor is shortened in comparison with the conventional base width $W_1$. As is well known, the current amplification factor of a bipolar transistor is increased when the base width is decreased. As a result, the current amplification factor of the PNP transistor is increased in comparison with the conventional PNP transistor.

Figure 5B:
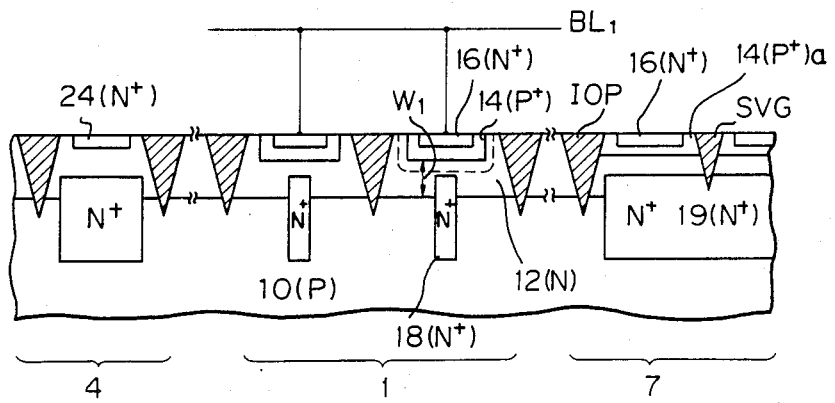
FIG. 5B is a cross-sectional view of a part of a conventional PROM for comparing it with the device shown in FIG. 5A.

FIG. 5B is a cross-sectional view of a conventional PROM, for comparison with the device shown in FIG. 5A. As will be apparent from FIG. 5B, since there is no P+-type buried layer in the conventional PROM, the base width is $W_1$ which is greater than the base width $W_2$.

Referring back to FIG. 5A, Tr represents an NPN transistor for constituting peripheral circuits such as the write-in circuit (WC) 7. In the transistor Tr, the N+-type diffusion region 16(N+) is its emitter region; a P+-type diffusion region 14(P+)a is its base region; and the N-type epitaxial layer 12(N) is its collector region. The N+-type buried layer 18(N+) is used as a collector contact region.

It should be noted that, in FIGS. 5A and 5B, the P+-type diffusion region 14(P+) in each memory cell is formed to be deeper than the P+-type diffusion region 14(P+)a in the transistor Tr in the peripheral circuit such as the write-in circuit (WC) 7. By this construction, the base width of the reverse current preventing PNP transistor in each memory cell is made as small as possible, so that its current amplification factor is further increased. The depth of the P+-type diffusion region 14(P+), however, is limited. That is, since a depletion layer is operatively formed, as illustrated by dash lines in the figures, between the P+-type diffusion region 14(P+) and the N-type epitaxial layer 12(N), the depletion layer may be in contact with the N+-type buried layer 18(N+) which is projected from the surface of the P-type semiconductor substrate 10(P) toward the P+-type diffusion region 14(P+), resulting in a lowered punch-through tolerance voltage, if the P+-type diffusion region 14(P+) is made too deep.

In the embodiment shown in FIG. 5A, because of the provision of the P+-type buried regions 20(P+) and 22(P+), the base width of the PNP transistor can be made practically smaller than that in the conventional device but, nevertheless, still remains within the limit of the depth of the P+-type diffusion region 14(P+).

The Shallow V-Grooves SVG shown in FIGS. 4, 5A, 5B, and 6 are provided for preventing write error operation due to parasitic PNPN transistors formed between neighbouring memory cells.

By the structure shown in FIGS. 4, 5A, 6, and 7 the current amplification factor of the reverse current preventing PNP transistor in each memory cell can be greatly increased in comparison with the conventional device, whereby the power consumption of the decoder/driver is greatly lowered. This will be explained referring back to FIG. 2.

In FIG. 2, the circuit diagram per se is the same in both the conventional device and the device according to the embodiment of the present invention. Therefore, in the following, the same reference symbols are applied to both the conventional device and the device of the present invention.

First, a conventional operation is described. For example, when a write operation is effected to the conventional memory cell $MC_0$, a current of, for example, 125 mA, must be applied from the bit line $BL_0$ through the programmable element $PE_0$ to the emitter of the conventional transistor $T_0$, for short-circuiting the programmable element $PE_0$. When the programmable element $PE_0$ is short-circuited, the conventional decoder/driver circuit $D_0$ in the conventional decoder/driver (DEC/DRIV) 2 must sink a large current of, for example, 95 mA, from the base of the transistor because of the small current amplification factor of the conventional transistor $T_0$.

On the other hand, in the reading operation, the emitter current of the conventional transistor $T_0$ may be as small as, for example, 0.5 mA. Therefore, the base current of the conventional transistor $T_0$ is also as small as $0.5 \times (95/125)$ mA.

Since the base current in the writing operation is so large, the conventional decoder/driver circuit $D_0$ is required to have a large driving power consumption, which conforms with the current sinking capability in a writing operation.

On the contrary, according to the embodiment shown in FIGS. 4, 5A, 6, and 7, since the current amplification factor of the transistor $T_0$ is greatly increased, almost all of the current supplied to the emitter of the transistor $T_0$ can be conducted to its collector. Therefore, the base current sunk by the decoder/driver circuit $D_0$ can be very small. For example, when the same write current of 125 mA is supplied to the emitter of the transistor $T_0$, the base current may be as small as about 6 mA, which is very small in comparison with the conventional base current of 95 mA.

Figure 8:
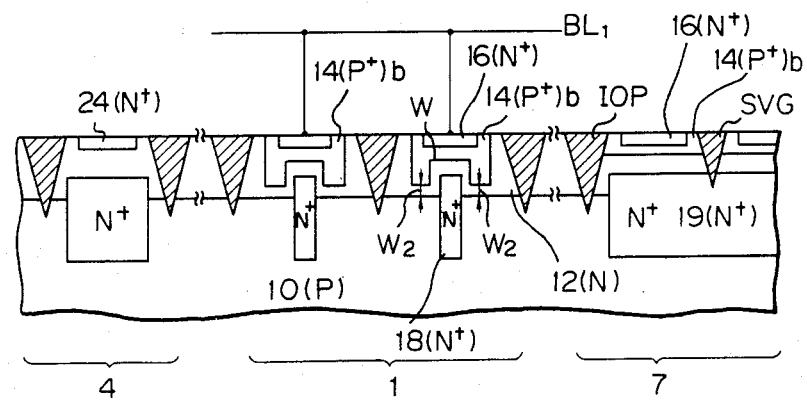
FIG. 8 is a cross-sectional view of a part of a PROM according to another embodiment of the present invention.

FIG. 8 is a cross-sectional view showing a part of a PROM according to another embodiment of the present invention. In FIG. 8, almost all portions are the same as those in FIG. 5A. The only difference between FIG. 8 and FIG. 5A is that, in FIG. 8, there is no P+-type buried region 20(P+) or 22(P+) which is provided in FIG. 5A, and, in place of these P+-type buried regions 20(P+) and 22(P+), a modified P+-type diffusion region 14(P+)b is formed in each memory cell. The modified P+-type diffusion region 14(P+)b has portions projecting toward the P-type semiconductor substrate. Each of the projecting portions is provided in an area where the N+-type buried layer 18(N+) is not present. The distance $W_2$ between the bottom surface of each of the projecting portions of the modified P+-type diffusion region 14(P+)b and the top surface of the P-type semiconductor region determines the base width of the reverse current preventing PNP transistor. The distance $W_2$ in FIG. 8 is also shortened in comparison with the conventional base width $W_1$ shown in FIG. 5B.

In the above described embodiments, the PROM includes junction-short type memory cells. The present invention, however, is not limited to the junction-short type memory cells, but may be also applied to a PROM including fuse-blown type memory cells.

In FIG. 5A, two P+-type buried regions 20(P+) and 22(P+) are provided in each memory cell. However, according to the present invention, the number of the P+-type buried regions may be other than two.

Also, in FIG. 8, the number of the projecting portions of the P+-type diffusion region 14(P+)b in each memory cell may be other than two.

Further, the P+-type buried regions 20(P+) and 22(P+) in FIG. 5A or the projecting portions of the P+-type diffusion region 14(P+) may be provided for each memory cell or may be commonly provided for memory cells arranged along a word line.

Still further, although IOP and SVG are employed as insulation and isolation regions, the present invention is not restricted to these type regions, and any other type isolation region may be employed if within the scope of the present invention.

From the foregoing description, it will be apparent that, according to the present invention, by making the base width of a transistor to be small, its current amplification factor is increased. When a decoder/driver in a PROM drives the transistor, the driving power consumption is lowered due to the increased current amplification factor. As a result, an increased packing density and a lower power consumption of a PROM can be achieved.

I claim:

1. A semiconductor device comprising:
  a semiconductor substrate of a first conductivity type;
  a first semiconductor region on said semiconductor substrate, of a second conductivity type opposite to said first conductivity type;
  a second semiconductor region in said first semiconductor region, of said first conductivity type;
  a high concentration buried region under said second semiconductor region, located partially in said first semiconductor region and partially in said semiconductor substrate underneath and contiguous to said first semiconductor region, said buried region being of said second conductivity type but with a higher impurity concentration than that of said first semiconductor region; and
  a further buried region, of said first conductivity type, located under said second semiconductor region and partially in said first semiconductor region and partially in said semiconductor substrate underneath and contiguous to said first semiconductor region.

2. A semiconductor device as set forth in claim 1, comprising a transistor with its collector region, base region and emitter region formed of said semiconductor substrate, said first semiconductor region and said second semiconductor region, respectively.

3. A semiconductor device as set forth in claim 2, wherein the distance between the top surface of said further buried region and the bottom surface of said second semiconductor region determines the base width of said transistor.

4. A semiconductor device as set forth in claim 3, wherein said transistor is a PNP transistor.

5. The device of claim 1, said further buried region having a higher conductivity than said semiconductor substrate and having a portion extending into said substrate.

6. A semiconductor device comprising:
  a semiconductor substrate of a first conductivity type;
  a first semiconductor region on said semiconductor substrate, of a second conductivity type opposite to said first conductivity type;
  a second semiconductor region in said first semiconductor region, of said firs conductivity type;
  a high concentration buried region under said second semiconductor region, located partially in said first semiconductor region and partially in said semiconductor substrate underneath and contiguous to said first semiconductor region, said buried region being of said second conductivity type but with a higher impurity concentration than the impurity concentration in said first semiconductor region; and
  said second semiconductor region having projections extending toward said semiconductor substrate, said projections being formed in a part of said first semiconductor region apart from said high concentration buried region.

7. A semiconductor device as set forth in claim 6, comprising a transistor with its collector region, base region and emitter region formed of said semiconductor substrate, said first semiconductor region, and said second semiconductor region, respectively.

8. A semiconductor device as set forth in claim 7, wherein the distance between the top surface of said semiconductor substrate and the bottom surface of said projections of said second semiconductor region determines the base width of said transistor.

9. A semiconductor device as set forth in claim 8, wherein said transistor is a PNP transistor.

10. A semiconductor device as set forth in claim 8, wherein said transistor is an NPN transistor.

* * * * *